United States Patent [19]

Takakuwa et al.

[11] Patent Number: 4,748,484
[45] Date of Patent: May 31, 1988

[54] HETEROJUNCTION FIELD EFFECT TRANSISTOR

[75] Inventors: Hidemi Takakuwa; Yoji Kato, both of Kanagawa, Japan

[73] Assignee: Sony Corporation, Tokyo, Japan

[21] Appl. No.: 823,639

[22] Filed: Jan. 29, 1986

[30] Foreign Application Priority Data

Jan. 30, 1985 [JP] Japan ................. 60-16042

[51] Int. Cl.[4] .............. H01L 29/80; H01L 29/161; H01L 29/48
[52] U.S. Cl. ........................... 357/22; 357/16; 357/15
[58] Field of Search .............. 357/16, 22 A, 22 MD, 357/22 I, 15

[56] References Cited

U.S. PATENT DOCUMENTS 4,688,061  8/1987  Sakaki .................. 357/22

FOREIGN PATENT DOCUMENTS 0148031  12/1984  European Pat. Off. ....... 357/22 MD
0184573  10/1984  Japan .................... 357/22 MD

OTHER PUBLICATIONS

IEEE Electron Device Letters, vol. EDL-2, No. 1, Jan. 1981, "Modulation . . . MESFET's", by Judaprawira, et al.

Japanese Journal of Applied Physics, vol. 21, No. 6, Jun. 1982, "Velocity . . . Concept", by Sakaki, pp. L381-L383.

Primary Examiner—Martin H. Edlow
Assistant Examiner—Don Featherstone
Attorney, Agent, or Firm—Hill, Van Santen, Steadman & Simpson

[57] ABSTRACT

A heterojunction field effect transistor according to the invention, comprises: first, second and third semiconductor layers which are sequentially stacked on each other; a first heterojunction formed between said first and second semiconductor layers; a second heterojunction formed between the second and third semiconductor layers; first and second two-dimensional electron gas layers formed in portions of the second semiconductor layer adjacent respectively to the first and second heterojunctions; and a gate electrode, a source electrode and a drain electrode formed on either of the first and third semiconductor layers, wherein the first two-dimensional electron gas layer extends from a portion corresponding to the gate electrode to the drain electrode and has one end virtually connected to the drain electrode, the second two-dimensional electron gas layer extends from a portion corresponding to the gate electrode to the source electrode and has one end virtually connected to the source electrode, and the number of electrons migrating between the first and second two-dimensional electron gas layers is modulated, in the portion of the second semiconductor layer corresponding to the gate electrode, by a voltage to be applied to the gate electrode, thereby controlling a current flowing between the source electrode and the drain electrode. With this structure, an effective gate length is defined by the thickness of the second semiconductor layer. Therefore, when the thickness of the second semiconductor layer is precisely controlled, a gate length can easily be shortened, and a current density can be increased when compared with a conventional device.

5 Claims, 2 Drawing Sheets

HETEROJUNCTION FIELD EFFECT TRANSISTOR

BACKGROUND OF THE INVENTION

1. Field of the Invention

The present invention relates to a heterojunction field effect transistor, which utilizes a two-dimensional electron gas layer formed at a heterojunction interface.

2. Description of the Prior Art

Conventionally, a HEMT (High Electron Mobility Transistor), shown in FIG. 1 is known. In the HEMT shown in FIG. 1, an undoped GaAs layer 2 and an n-type $Al_xGa_{1-x}As$ layer 3 are sequentially epitaxially grown on a semi-insulating GaAs substrate 1. A Schottky gate electrode 4, a source electrode 5 and a drain electrode 6 are formed on the n-type $Al_xGa_{1-x}As$ layer 3. The source electrode 5 and the drain electrode 6 reach the GaAs layer 2 through the n-type $Al_xGa_{1-x}As$ layer 3.

In the HEMT shown in FIG. 1, a heterojunction 7 is formed between the n-type $Al_xGa_{1-x}As$ layer 3 and the GaAs layer 2. A two-dimensional electron gas layer 8 is formed in a portion of the GaAS layer 2 adjacent to the heterojunction 7. This may be understood upon reference to an energy band diagram shown in FIG. 2. As there shown, an approximately inverted-triangular potential well is formed at a conduction band edge $E_c$ in the portion of the GaAs layer 2 adjacent to the heterojunction 7. Electrons migrating from the n-type $Al_xGa_{1-x}As$ layer 3 to the GaAs layer 2 due to an energy difference at the conduction band edge $E_c$ between the n-type $Al_xGa_{1-x}As$ layer 3 and the GaAs layer 2 are accumulated in this well, thus forming the two-dimensional electron gas layer 8. A step $\Delta E_c$ of the conduction band edge $E_c$ at an interface of the heterojunction 7 is about 0.3 eV when an Al composition ratio x is 0.3.

The HEMT shown in FIG. 1 is termed a forward HEMT. In addition to this type, a so-called reverse HEMT (whose energy band diagram is shown in FIG. 3), is known, wherein a stacking order of a GaAs layer and an n-type $Al_xGa_{1-x}As$ layer 3 is reversed. Furthermore, in order to increase a concentration $n_s$ of the two-dimensional electron gas layer 8, n-type $Al_xGa_{1-x}As$ layers have been formed at both sides of a GaAs layer so as to obtain a so-called double heterojunction FET (whose energy band diagram is shown in FIG. 4) which combines forward and reverse HEMTs having a common GaAs layer.

The above-mentioned forward HEMT reverse HEMT, and double heterojunction FET have common structural characteristics wherein current paths run parallel to the substrate surface, and a high electron mobility at the two-dimensional electron gas layer formed in a portion of a GaAS layer adjacent to the heterojunction is utilized. Accordingly, the above-mentionedd forward HEMT, reverse HEMT, and double heterojunction FET still have a problem of low planar patterning precision as in a conventional GaAs FET. Due to this problem, their gate lengths cannot be shortened beyond a certain limit. In addition to these, the conventional HEMTs have a limited current density, thus limiting their performance.

OBJECT AND SUMMARY OF THE INVENTION

It is an object of the present invention to provide a heterojunction field effect transistor, which is free from the above-mentioned drawbacks in the prior art, and effectively utilize a high electron mobility of a HEMT.

According to the present invention, there is provided a heterojunction field effect transistor, comprising: first, second and third semiconductor layers which are sequentially stacked on each other; a first heterojunction formed between the first and second semiconductor layers; a second heterojunction formed between the second and third semiconductor layers; first and second two-dimensional electron gas layers formed in portions of the second semiconductor layer adjacent respectively to the first and second heterojunctions; and a gate electrode; a source electrode and a drain electrode formed on either of the first and third semiconductor layers, wherein the first two-dimensional electron gas layer extends from a portion corresponding to the gate electrode to the drain electrode and has one end virtually connected to the drain electrode, the second two-dimensional electron gas layer extends from a portion corresponding to the gate electrode to the source electrode and has one end virtually connected to the source electrode, and the number of electrons migrating between the first and second two-dimensional electron gas layers is modulated, in the portion of the second semiconductor layer corresponding to the gate electrode, by a voltage to be applied to the gate electrode, thereby controlling a current flowing between the source electrode and the drain electrode.

With this structure, an effective gate length is defined by the thickness of the second semiconductor layer. Therefore, when the thickness of the second semiconductor layer is precisely controlled, the gate length can easily be shortened, and current density can be increased compared to a conventional device.

DETAILED DESCRIPTION OF THE PREFERRED EMBODIMENT

A heterojunction field effect transistor (FET) according to one embodiment of the present invention will be described with reference to the accompanying drawings.

Figure 1:
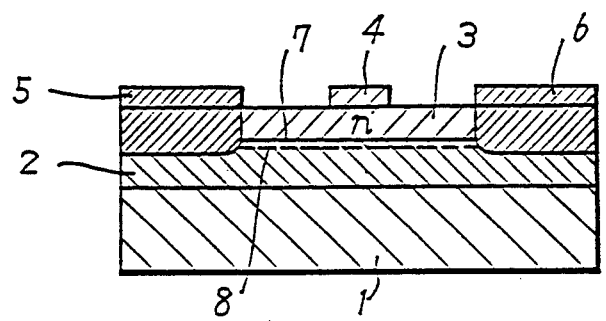
FIG. 1 is a sectional view showing a conventional forward HEMT.
Figure 2:
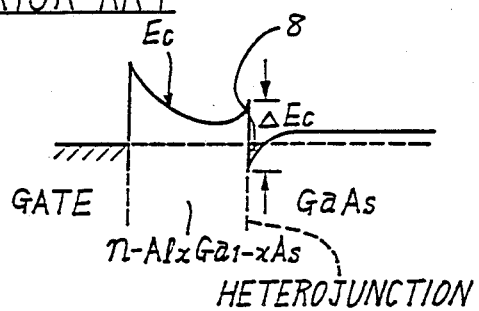
FIG. 2 is an energy band diagram of the forward HEMT shown in FIG. 1.
Figure 3:
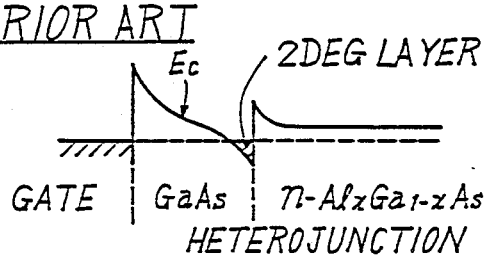
FIG. 3 is an energy band diagram of a conventional reverse HEMT.
Figure 4:
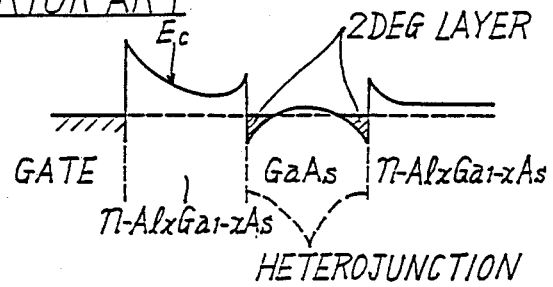
FIG. 4 is an energy band diagram of a conventional double heterojunction FET.
Figure 5:
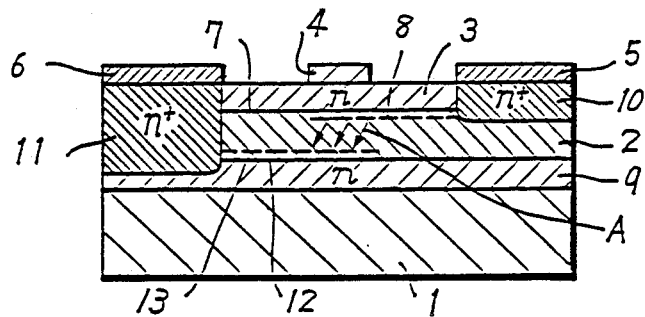
FIG. 5 is a sectional view showing a heterojunction FET according to an embodiment of the present invention.

In a heterojunction FET of this embodiment, as shown in FIG. 5, an n-type $Al_xGa_{1-x}As$ layer 9, an undoped GaAs or p-type GaAs layer 2, and an n-type $Al_xGa_{1-x}As$ layer 3 are sequentially epitaxially grown on a semi-insulating GaAs substrate 1 by, for example, an MBE method (or an MO-CVD method). A Schottky gate electrode 4 of, for example, Ti/Pt/Au, a source electrode 5 of, for example, AuGe/Ni, and a drain electrode 6, of, for example, AuGe/Ni, are formed on the n-type Al$_x$Ga$_{1-x}$As layer 3. An n$^+$-type layer 10 extending to the GaAs layer 11 extending to the n-type Al$_x$Ga$_{1-x}$As layer 9 are formed under the source electrode 5 and the drain electrode 6, respectively.

In the heterojunction FET of this embodiment, a heterojunction 12 is formed between the n-type Al$_x$Ga$_{1-x}$As layer 9 and the GaAs layer 2. A two-dimensional electron gas layer 13 is formed in a portion of the GaAs layer 2 adjacent to the heterojunction 12, and a two-dimensional electron gas layer 8 is formed in a portion of the GaAs layer 2 adjacent to the heterojunction 7. These two-dimensional electron gas layers 8 and 13 are normally formed along the overall length of the heterojunctions 7 and 12. However, in this embodiment, unnecessary portions of the two-dimensional electron gas layers are eliminated by ion-implanting ions, for example, H$^+$, B$^+$, or the like) so that two-dimensional electron gas layers 8 and 13 are present in necessary portions extending from portions below the Schottky gate electrode 4 to the n$^+$-type layers 10 and 11. Therefore, the two-dimensional electron gas layers 8 and 13 overlap vertically (in a direction perpendicular to the substrate surface) only in a portion below the Schottky gate electrode 4. In order to locally eliminate a two-dimensional electron gas layer, an etching method can be used in addition to the ion-implantation method mentioned above.

The operation of the heterojunction FET of FIG. 5 according to the embodiment of the present invention will now be explained.

Figure 6A:
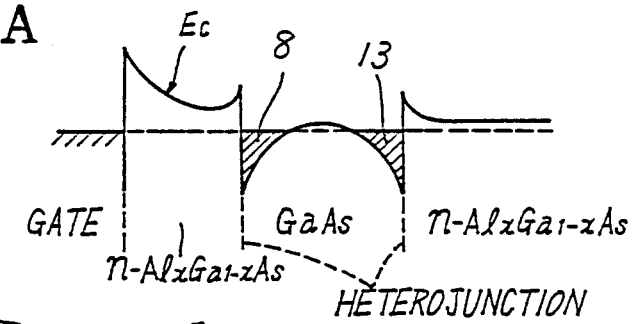
FIGS. 6A and 6B are energy band diagrams for explaining an operation of the heterojunction FET shown in FIG. 5.

As shown in FIG. 6A, in an equilibrium state wherein no voltage is applied to the Schottky gate electrode 4, the source electrode 5, and the drain electrode 6, the two-dimensional electron gas layers 8 and 13 formed in the portions of the GaAs layer 2 respectively adjacent to the heterojunctions 7 and 12 are separated.

Figure 6B:
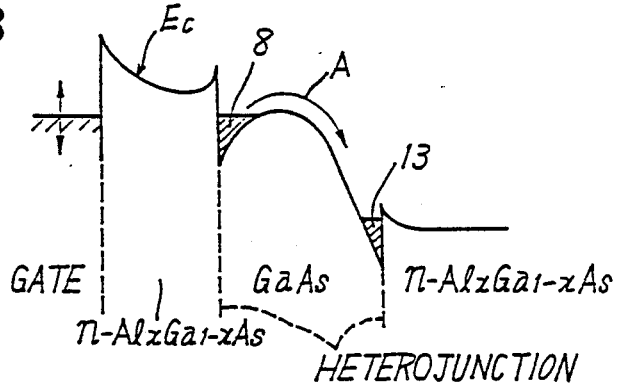

When a predetermined bias voltage is applied between the source and drain, a gate voltage is applied to the Schottky gate electrode 4, as shown in FIG. 6B. When the gate voltage is changed, a concentration n$_s$ of the two-dimensional electron gas layer 8 at the source side is controlled, so that the number of electrons migrating from the two-dimensional electron gas layer 8 to the two-dimensional electron gas layer 13 at the drain side beyond a potential barrier present in the GaAs layer 2 between the two-dimensional electron gas layers 8 and 13 in a direction indicated by arrow A (see FIG. 5) is modulated, thereby controlling a current flowing between the source and drain. As can be seen from this fact, in this embodiment, a distance (substantially equal to the thickness of the GaAs layer 2) between the two-dimensional electron gas layers 8 and 13 defines an effective gate length.

The heterojunction FET of the above embodiment has advantages. In the heterojunction FET of the above embodiment, the effective gate length is determined by the thickness of the GaAs layer 2, as described above. The thickness of the GaAs layer 2 can be controlled with precision, on the order of several Å to several tens of Å, by using an MBE method or an MO-CVD method. Therefore, the gate length can be easily shortened without being restricted by a planar patterning precision when compared with the conventional HEMT. Since the two-dimensional electron gas layers 8 and 13 act as current paths between the source and gate and between the gate and drain, electron mobility is extremely high as well as in the conventional HEMT.

Furthermore, electrons migrate in the GaAS layer 2 below the Schottky gate electrode 4 in the direction indicated by arrow A, and hence a current flows in the opposite direction. Therefore, current per unit area, i.e., current density, is very high when compared with the conventional HEMT in which a current flows parallel to the GaAs layer 2.

According to the above embodiment of the present invention, a high-speed, high-performance heterojunction FET can be realized.

In the above embodiment, when the thickness of the GaAS layer 2 is selected to be equal to a mean free path of electrons in GaAs, a so-called ballistic operation can also be realized.

Figure 7:
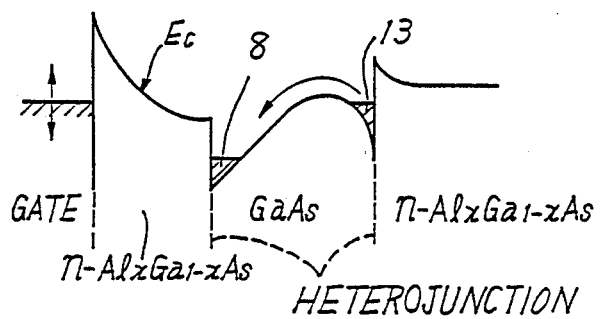
FIG. 7 is an energy band diagram for explaining an operation of a heterojunction FET according to another embodiment of the present invention.

One embodiment of the present invention has been described. However, the present invention is not limited to that particular embodiment, and various changes and modifications may be made within the spirit and scope of the invention. For example, the source electrode 4 in the above embodiment can be used as a drain electrode, and vice versa, if desired. In that case, as shown in FIG. 7, the number of electrons migrating from a two-dimensional electron gas layer at the source side to that at the drain side can be modulated by the gate voltage.

In the latter embodiment, a p-type GaAs layer can be used instead of the undoped GaAs layer 2. Furthermore, the semi-insulating GaAs substrate 1, the GaAs layer 2, and the n-type Al$_x$Ga$_{1-x}$As layers 3 and 9 can be replaced with other types of semiconductor substrate or layers. In the above embodiment, the n$^{+-}$ type layers 10 and 11 are connected to the two-dimensional electron gas layers 8 and 13. However, alloy layers can be formed in place of the n$^{+-}$ type layers 10 and 11, and two-dimensional electron gas layers 8 and 13 can be connected thereto. Further such modifications may be made within the scope of our invention, and it is intended that the scope of our invention be limited solely by that of the appended claims.

We claim as our invention:

1. A heterojunction field effect transistor, comprising: first, second and third semiconductor layers which are sequentially stacked on each other; a first heterojunction formed between said first and second semiconductor layers; a second heterojunction formed between said second and third semiconductor layers; first and second two-dimensional electron gas layers formed in portions of said second semiconductor layer adjacent respectively to said first and second heterojunctions; a gate electrode, a source electrode and a drain electrode, one of said electrodes being formed on said first and the other on said third semiconductor layer, wherein said first two-dimensional electron gas layer extends from an area at the first heterojunction situated at a region below said gate electrode to said drain electrode and has one end extending to said drain electrode, said second two-dimensional electron gas layer extends from an area at the second heterojunction situated at a region below said gate electrode to said source electrode and has one end extending to said source electrode, and wherein the number of electrons migrating between said first and second two-dimensional electron gas layers is modulated, in the portion of said second semiconductor layer corresponding to said gate electrode, by a voltage to be applied to said gate electrode, thereby controlling the current flowing between said source electrode and said drain electrode.

2. A heterojunction field effect transistor according to claim 1, wherein said first, second, and third semiconductor layers are sequentially formed on a semiconductor substrate.

3. A heterojunction field effect transistor according to claim 2, wherein said semiconductor substate is a GaAs substrate.

4. A heterojunction field effect transistor according to claim 1, wherein said first and third semiconductor layers are n-type $Al_xGa_{1-x}As$ layers and said second semiconductor layer is an undoped GaAs layer or a p-type GaAs layer.

5. A heterojunction field effect transistor according to claim 1, wherein said first and second two-dimensional electron gas layers overlap with each other only below said gate electrode.

* * * * *